(12) United States Patent
Moncada et al.

(10) Patent No.: US 7,088,211 B2
(45) Date of Patent: Aug. 8, 2006

(54) SPACE SAVING SURFACE-MOUNTED INDUCTORS

(75) Inventors: Jose Agerico R. Moncada, North Point (HK); Lawrence Chui, Tai Po (HK); Man Chuen Wong, North Point (HK)

(73) Assignee: Astec International Limited, Kwun Tong (HK)

( * ) Notice: Subject to any disclaimer, the term of this patent is extended or adjusted under 35 U.S.C. 154(b) by 0 days.

(21) Appl. No.: 10/621,208

(22) Filed: Jul. 15, 2003

(65) Prior Publication Data

US 2005/0012585 A1    Jan. 20, 2005

(51) Int. Cl.
*H01F 27/02* (2006.01)

(52) U.S. Cl. .............................. 336/65; 336/192; 336/83

(58) Field of Classification Search ................ 336/83, 336/223, 212, 213, 200, 232, 192, 65, 67; 29/602.1
See application file for complete search history.

(56) References Cited

U.S. PATENT DOCUMENTS

| 3,585,553 | A | * | 6/1971 | Muckelroy et al. | 336/192 |
| 3,745,500 | A | * | 7/1973 | Simon | 336/192 |
| 4,704,592 | A | * | 11/1987 | Marth et al. | 336/83 |
| 5,740,787 | A | * | 4/1998 | Ando | 123/635 |
| 6,075,430 | A | * | 6/2000 | Lindqvist | 336/83 |
| 6,392,523 | B1 | * | 5/2002 | Tsunemi | 336/192 |
| 6,512,175 | B1 | * | 1/2003 | Gutierrez | 174/52.4 |
| 6,680,664 | B1 | * | 1/2004 | Fan | 336/83 |

* cited by examiner

*Primary Examiner*—Anh Mai
(74) *Attorney, Agent, or Firm*—Nixon Peabody LLP

(57) ABSTRACT

An inductive element and corresponding method for making an inductive element for surface mounting on an adjacent structure for providing improved heat transfer characteristics. Specifically, a core and winding of the inductive element define coplanar surfaces that can then be mated to an adjacent structure, preferably a printed circuit board. Devices such as inductors or transformers including the inductive element have multiple, low thermal resistance conductive paths for removing heat from the core, and thereby enhance the heat transfer characteristics of the devices. The inductive element is particularly well suited for power electronics, such as for use as a power choke or as part of a power transformer.

8 Claims, 4 Drawing Sheets

SPACE SAVING SURFACE-MOUNTED INDUCTORS

FIELD OF THE INVENTION

The present invention relates to structures and methods for augmenting space utilization and heat transfer in electronic devices and, in particular, to structures and methods that provide configurations of a core and winding so as to improve both space utilization and heat flow from a surface mounted inductor formed from these components.

BACKGROUND OF THE INVENTION

The performance, reliability and lifetime of electronic circuits are affected by the temperature of the various circuit components. Power electronics, in particular, usually have one or more components that generate large amounts of heat, and thus may require heat transfer augmentation structures to dissipate this heat and thereby maintain acceptable operating temperatures. Constraints on the maximum size of a circuit can further increase the difficulty of removing heat, making thermal management an important aspect of power electronics design.

A particularly difficult problem is the removal of heat from printed circuit board (PCB) mounted inductors and transformers. The operation of the circuit results in the generation of large amounts of heat within the core and a resulting increase in core temperature. Due to the desirability of having the inductor occupy a small surface area of the PCB, and the normal inductor geometry of having a core surrounded by a winding, it can be difficult to transfer heat from the core to the surrounding environment.

More specifically, prior art transformers, and in particular surface-mounted transformers for power electronics, typically include windings around torroidal cores. The core in such a transformer is surrounded by the winding wires, which wrap around a significant portion, if not the entire outer surface of the torroid. Heat within the core can therefore only be removed by conduction through the wires of the winding to an adjacent heat sink. The torroidal core also wastes space because it includes a large unoccupied hole in its center.

What is needed is an improved surface-mountable design that provides for improved space utilization as well as enhanced heat transfer from the core of a transformer or inductor to a heat sink. Such an inductor or transformer should have a small footprint, be efficient, inexpensive, and compatible with conventional surface mount technology, such as enabling reflow soldering of the inductor or transformer to a PCB.

SUMMARY OF THE INVENTION

The present invention solves the above-identified problems of known surface mountable inductors and transformers by providing a winding and core structure that fully occupies available space and provides for coplanar contact of both the core ends and the winding with an adjacent heat sink.

In a preferred embodiment of the present invention, a surface mountable inductive element comprises a magnetic core having a central elongated portion and two end portions, each said end portion defining an end portion planar surface, and a winding wound about said elongated portion, where the outer surface of said winding defines a planar surface that is coplanar with each said end portion planar surface so as to facilitate surface mounting of said magnetic core and winding on an adjacent structure.

According to another aspect of the present invention, the inductive element comprises a first magnetic core having a central elongated portion and two end portions, each said end portion defining an end portion planar surface, a first winding wound about said elongated portion, where the outer surface of said first winding defines a planar surface that is coplanar with each said end portion planar surface, and a mounting frame to secure the wire ends of said first winding and to enable said first core and first winding to be surface mounted on an adjacent structure such that a portion of the planar surface of said adjacent structure is in contact with said end portion planar surfaces and said first winding planar surface to enhance heat transfer to said adjacent structure from said inductive element. The inductive element preferably also includes a second magnetic core having an elongated portion and two end portions, each said end portion of said second core defining an end portion planar surface, a second winding wound about said elongated portion of said second core, where the outer surface of said second winding defines a planar surface that is coplanar with each said second core end portion planar surface, and wherein said mounting frame further secures the wire ends of said second winding and is shaped to affix said first core end portions against corresponding second core end portions and such that the coplanar surfaces of said first core end portions and said first winding are coplanar with the coplanar surfaces of said second core end portions and said second winding.

According to yet another aspect of the present invention, a transformer comprises first and second magnetic cores each having a central elongated portion and two end portions, each said end portion defining an end portion planar surface, a winding about each said elongated portion of said two magnetic cores, where the outer surface of each winding defines a planar surface that is coplanar with each said end portion planar surface of its respective core, and a material for affixing the end portions of said first and second magnetic cores together such that the end portion planar surface of each end portion of said first core is coplanar with the end portion planar surface of each end portion of said second core. The transformer preferably also includes a mounting frame surrounding said first and second cores, wherein said mounting frame secures the wire ends of each said winding and enables said first and second core to be surface mounted on an adjacent structure such that a portion of the planar surface of said adjacent structure is in contact with said end portion planar surfaces and the planar surfaces of each said winding to enhance heat transfer to said adjacent structure from said transformer.

In a preferred embodiment, the adjacent structure on which the inductor or transformer according to the present invention is mounted is a printed circuit board.

It is yet another aspect of the present invention to provide a method of forming an inductive element from a core having a central elongated portion and two end portions for surface mounting to an adjacent structure, e.g., the surface of a printed circuit board or the like. The method includes the steps of forming a winding of wire about the central elongated portion of the core to create a surface on said winding that is coplanar with a surface on each end of said core, and mounting said core in a mounting frame and securing the wire ends of said winding to posts on said mounting frame.

It is another aspect of the present invention to provide an inductive element having a small footprint with improved heat transfer from the transformer core to an adjacent structure, thereby enabling lower temperature rated materials to be used that in the past for the same applications.

A further understanding of the invention can be had from the detailed discussion of the specific embodiment below. For purposes of clarity, this discussion refers to devices, methods, and concepts in terms of specific examples. However, the method of the present invention may be used to connect a wide variety of types of devices. It is therefore intended that the invention not be limited by the discussion of specific embodiments.

BRIEF DESCRIPTION OF THE DRAWINGS

The foregoing aspects and the attendant advantages of the present invention will become more readily appreciated by reference to the following detailed description, when taken in conjunction with the accompanying drawings, wherein:

FIGS. 4A–4C are views of a first embodiment of an inductive element according to the present invention, where FIG. 4A is a top view, FIG. 4B is a side view, and FIG. 4C is sectional view along the line 4C—4C of FIG. 4A, showing two inductive element cores joined together;

FIGS. 5A–5C are views of a second embodiment of an inductive element according to the present invention, where FIG. 5A is a top view, FIG. 5B is a side view, and FIG. 5C is sectional view along the line 5C—5C of FIG. 5A, showing two inductive element cores joined together.

Reference symbols are used in the Figures to indicate certain components, aspects or features shown therein, with reference symbols common to more than one Figure indicating like components, aspects or features shown therein.

DETAILED DESCRIPTION OF THE INVENTION

To facilitate its description, the invention is described below in terms of a core and winding design for a surface-mounted inductive element, such as a PCB mountable inductor, power choke, or transformer. In general, the present invention is a core and winding configuration that facilitates removal of heat from the core to the exterior of the inductive element by creating a second heat transfer path from the core to the external environment. The device permits the coplanar mounting of the core and the winding to the PCB so that heat in the core can be conducted to the PCB through both the core ends and the winding. It is understood that the inventive device can be used to improve the heat flow from inductors and transformers in general and is particularly useful in removing heat from power converter transformers mounted on printed circuit boards or the like. The scope of the invention is not limited by the following embodiments.

Figure 1:
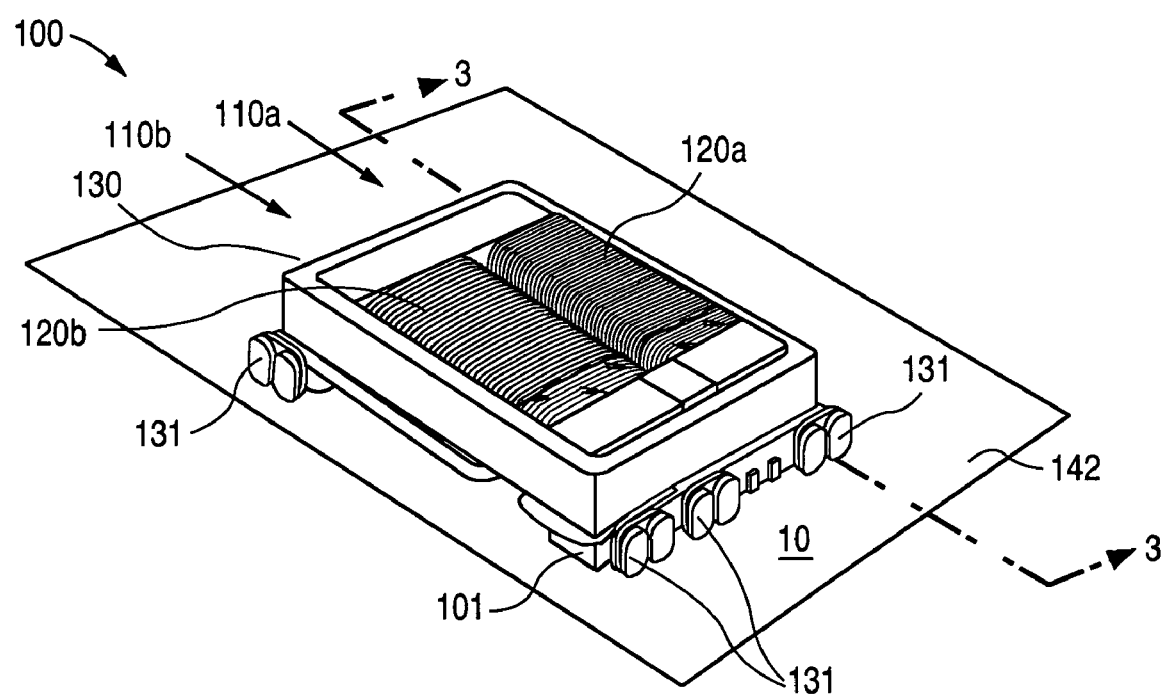
FIG. 1 is a perspective view of an inductive element comprising two cores joined together according to the present invention and mounted on a PCB.
Figure 2A:
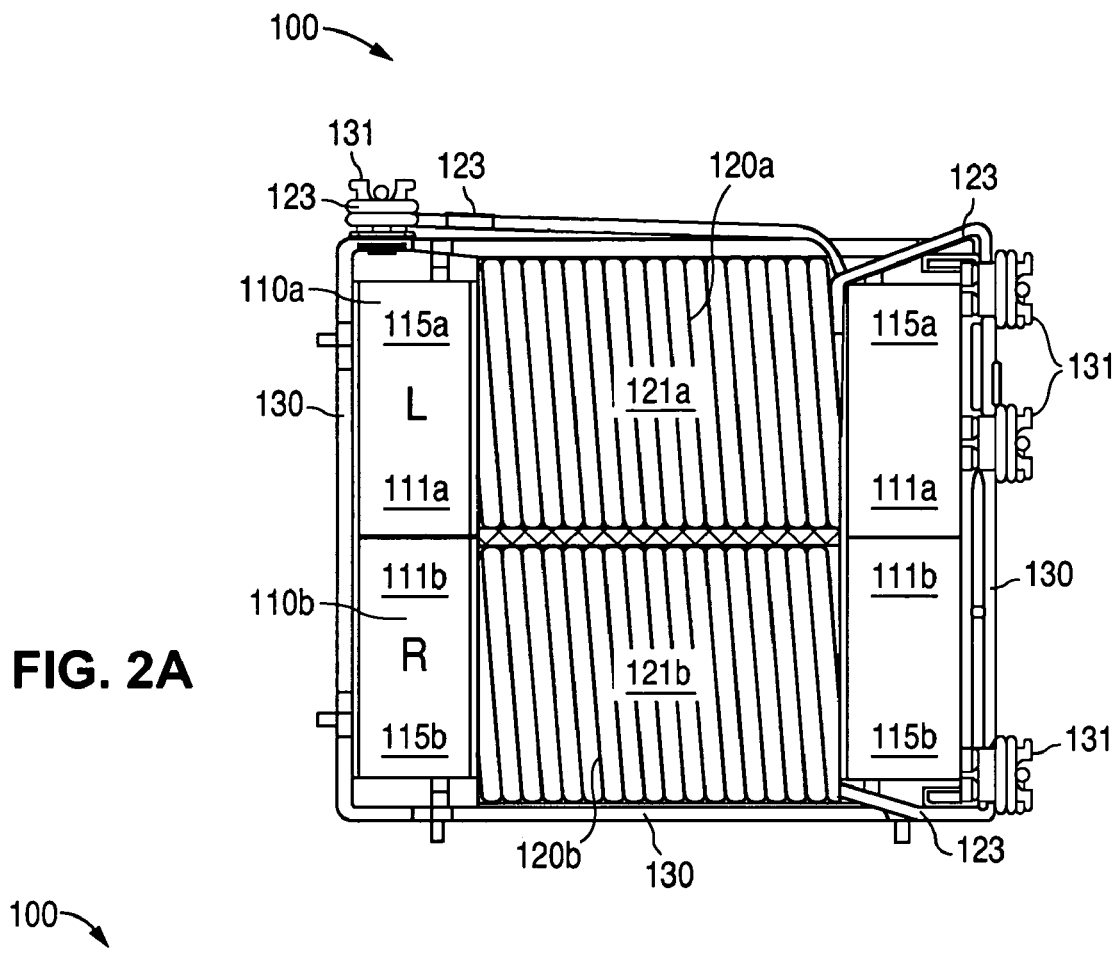
FIGS. 2A and 2B are side and bottom views of the inductive element of FIG. 1
Figure 2B:
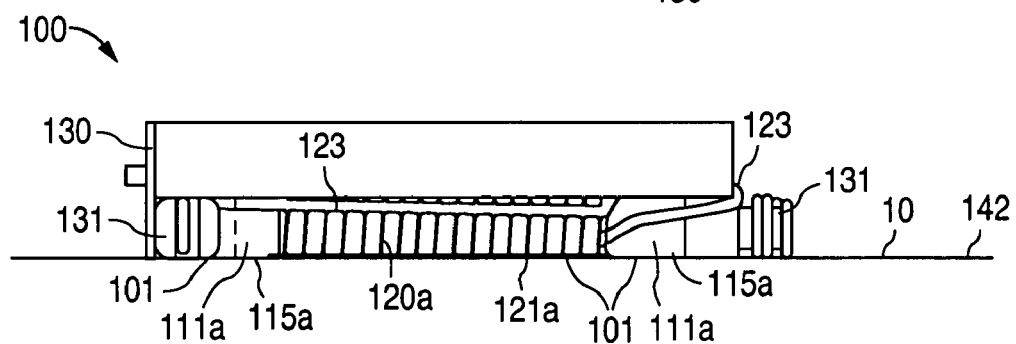
Figure 2C:
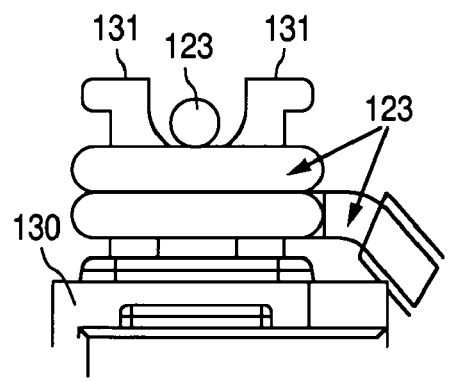
FIG. 2C is an enlarged view of a mounting frame post with the wire end of a winding secured thereto.
Figure 3:
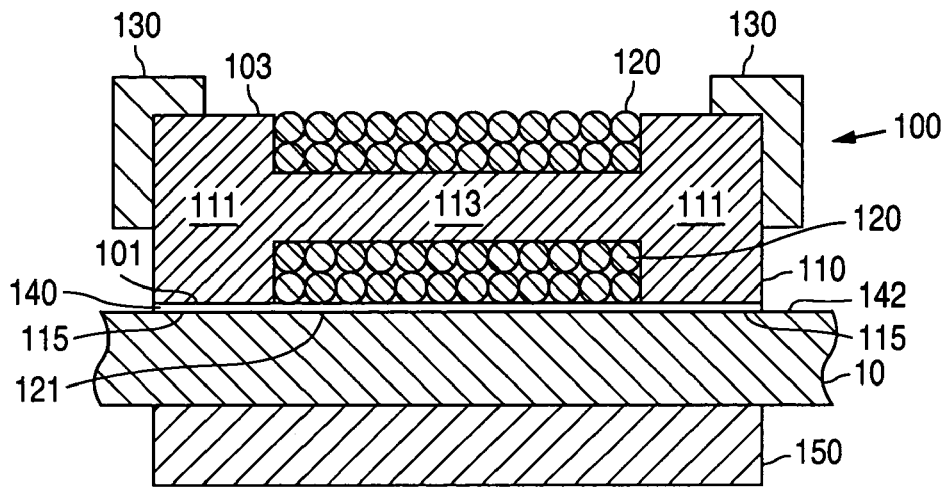
FIG. 3 is a sectional view along the line 3—3 of the inductive element of FIG. 1.

The present invention will now be described in more detail with reference to the Figures. FIGS. 1–3 are several views of an inductive element 100 structured as a transformer or power choke, according to the present invention, having a surface 101 for surface mounting the inductive element on a printed circuit board (PCB) 10, where FIG. 1 is a perspective view of the inductive element mounted the surface of the PCB, FIGS. 2A and 2B are bottom and side views of inductive element 100, respectively, and FIG. 3 is a sectional view 3—3. Power choke/transformer 100 has conventional electrical operating characteristics that are a function of its configuration, as is well known in the field of power electronics. In addition, the mounting and use of surface-mounted transformers is similarly well known in the field and will not be repeated here.

Inductive element 100 may include a single core having a single winding wound around it. Preferably, it includes a pair of matching cores 110, individually denoted 110a and 110b, and a winding 120 about each core, indicated as winding 120a and 120b. More specifically, each core 110 has a pair of ends 111 and an elongated portion 113 that supports the corresponding winding 120. Each winding 120 is bounded on the inside by elongated portion 113 and defines an outer surface 121, as shown in FIGS. 2 and 3. In addition, each end 111 has a surface 115. Surfaces 115a, 115b, 121a, and 121b are approximately coplanar to define surface 101. Inductive element 100 also has a surface 103 opposite surface 101 that may be coplanar with the surfaces of core ends 111 and windings 120 that are similarly opposite to surfaces 115 and 121, respectively.

Inductive element 100 also includes a mounting frame 130 having posts 131 adjacent to surface 101. Mounting frame 130 is preferably an insulating material, such as plastic. As shown more clearly in FIGS. 2 and 3, each winding 120 includes a conducting material, such as a metallic ribbon or wire, wound at least once about elongated portion 113. In addition, windings 120 terminate in wires 123 at posts 131. More specifically, each of wires 123 wraps about one of posts 131 and has an exposed portion near surface 101 to facilitate electrical connections between inductive element 100 and conductive traces (not shown) on PCB 10. FIG. 2C is an enlarged view of an exemplary post 131 having a wire 123 wrapped around it.

Surface 101 of inductive element 100 is mounted on PCB 10 by soldering posts 131 to the PCB, preferably by reflow soldering. As noted previously, surface 115 of core 110 and surface 121 of winding 120 are approximately coplanar and define surface 101. A thin thermally conductive adhesive or paste 140 applied between surfaces 115 and 121 and the surface 142 of PCB 10, provides enhanced thermal coupling between the core 110 and winding 120 and the PCB 10. Heat within core 110 can thus conduct to PCB 10 either through windings 120 or through the ends 111 of core 110.

In addition, a heat sink 150 may be provided on the side of PCB 10 opposite inductive element 100. The use of heat sinks to remove heat and thus reduce the temperature of heat generating components is well known in the art. Heat sink 150 includes, but is not limited to, the illustrated heat sink, and may include fins, enlarged surfaces that extend beyond the footprint of the inductive element 100, or may include active elements such as thermionic cooling or heat pipes, or any other configuration or devices that effectively promote the transfer of heat from the inductive element to the external environment.

The scope of the present invention is not limited to transformers or power chokes as shown in FIGS. 1–3. In general, the inventive inductive element is not limited to the size or number of windings on the individual cores, or to the number of cores. It is within the scope of the present invention to provide an inductive element having more than two cores 110 and windings 120, or an inductor having only a single core and winding. In addition, it within the scope of the present invention, for multi winding inductive elements, to provide a post for attaching each end of each winding to a PCB via an appropriately sized and shaped mounting frame. Also, it is within the scope of the present invention to mount a heat sink on surface 103 of inductive element 100.

Figure 4C:
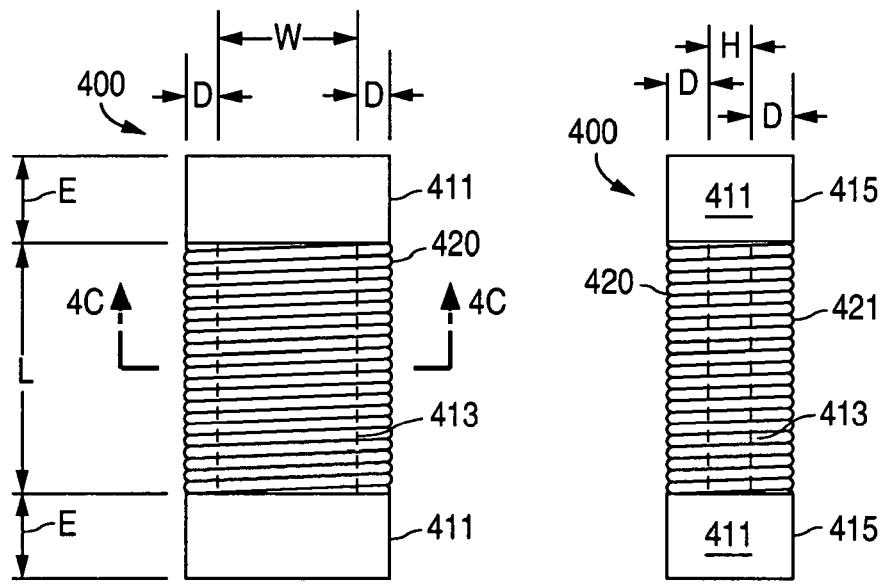
Figure 4C:
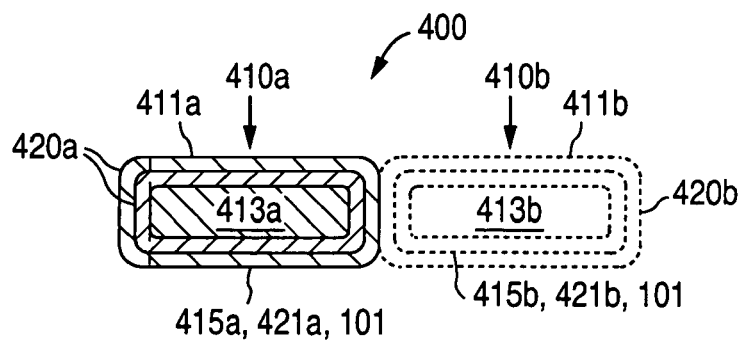

A first embodiment of an inductive element according to the present invention is shown at 400 in FIGS. 4A–4C, where FIG. 4A is a top view, FIG. 4B is a side view, and FIG. 4C is sectional view 4C—4C of a core 410 and a winding 420. FIG. 4C also shows a second core 410b (in phantom next to a first core 410a), arranged as an inductive element of the type shown at 100 in FIGS. 1 and 2. Each core 410 includes an elongated portion 413 of length L between a pair of ends 411, and a wire 420 having ends 423 that are wrapped along length L. FIGS. 4A and 4B show elongated portion 413 in phantom through the center of winding 420. Side view FIG. 4B shows coplanar core and winding surfaces, specifically a core surface 415 and a winding surface 421.

FIG. 4C shows a sectional view of core 410a placed side-by-side with core 410b shown in phantom. Surface 101 of inductive element 400 includes the coplanar surface defined by surfaces 415a, 415b, 421a, and 421b.

Elongated portion 413 has dimensions, indicated as a width W and a depth D, that provide the required electromagnetic properties of windings 420, as is known in the field. Core ends 411 protrude from elongated portion 413 by a height D resulting in ends having rectangular shapes with a depth E, width W+2D, and height H+2D. The elongated portion 413 has an approximately rectangular cross-sectional shape. The dimensions of ends 411 are selected to provide mounting surfaces for winding 420. Specifically, winding 420 is wrapped along length L to occupy a thickness D, such that the wire fills in the space between the elongated portion 413 and ends 411. Alternatively, winding 420 could have another shape that presents a pair of approximately planar surfaces, not necessarily parallel, for mounting to a PCB and, if desired, an additional heat sink.

Figure 5C:
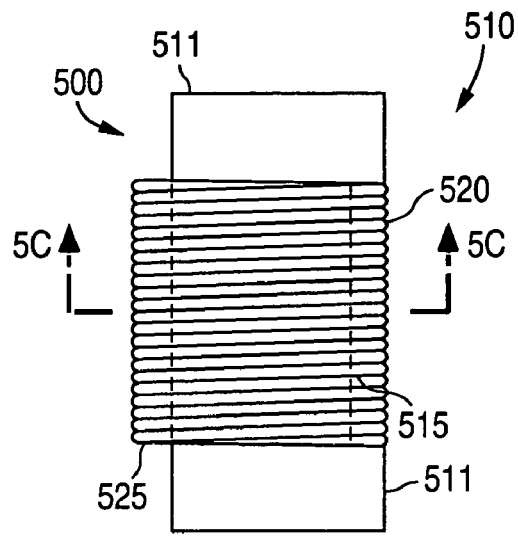
Figure 5C:
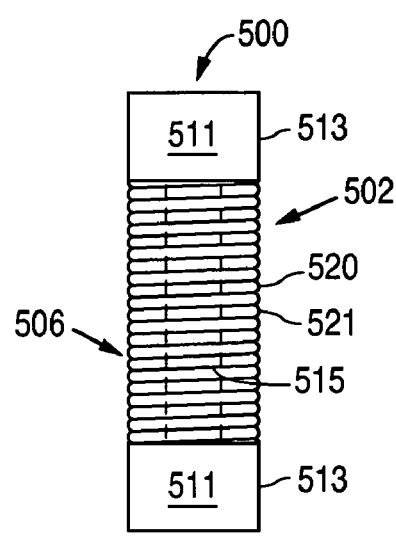
Figure 5C:
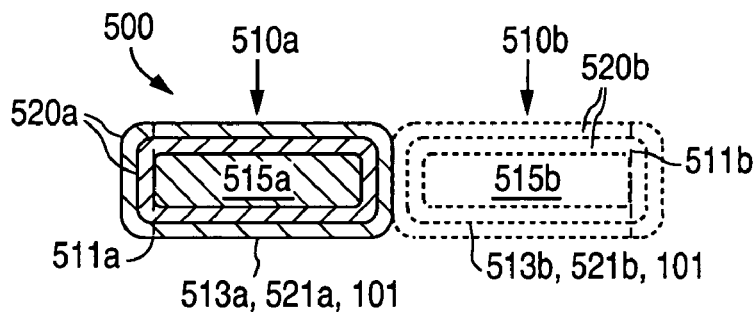

A second embodiment of an inductive element according to the present invention is shown at 500 in FIGS. 5A–5C, where FIG. 5A is a top view, FIG. 5B is a side view, and FIG. 5C is sectional view 5C—5C of a core 510 and a winding 520. FIG. 5C also shows a second core 510b (in phantom next to a first core 510a), arranged as an inductive element of the type shown at 100 in FIGS. 1 and 2. Each core 510 includes an elongated portion 515 between a pair of ends 511, and a wire 520 having ends 523 that are wrapped along the elongated portion. FIGS. 5A and 5B show elongated portion 515 in phantom through the center of winding 520. Side view FIG. 5B shows the coplanar core and winding surfaces, specifically a core surface 513 and a winding surface 521.

FIG. 5C shows a sectional view of core 510a placed side-by-side with core 510b shown in phantom. Surface 101 of inductive element 500 includes the coplanar surface defined by surfaces 513a, 513b, 521a, and 521b.

Cores 410 include an elongated member 413 that terminates in the center of ends 411. In contrast, cores 510 include an elongated member 515 that does not terminate in the center of end 511. As is shown in FIG. 5C, winding 520 thus protrudes beyond the edge in that core's ends 511, as seen at 525. It is not necessary for each of the cores to have the same geometry. Thus, for example, an alternative embodiment for a two winding power choke could have one core 410 and one core 510.

The inventive inductive element 100, 400, 500 differs from the prior art in that it provides two paths for heat conduction from the core to a heat sink.

Figure 6:
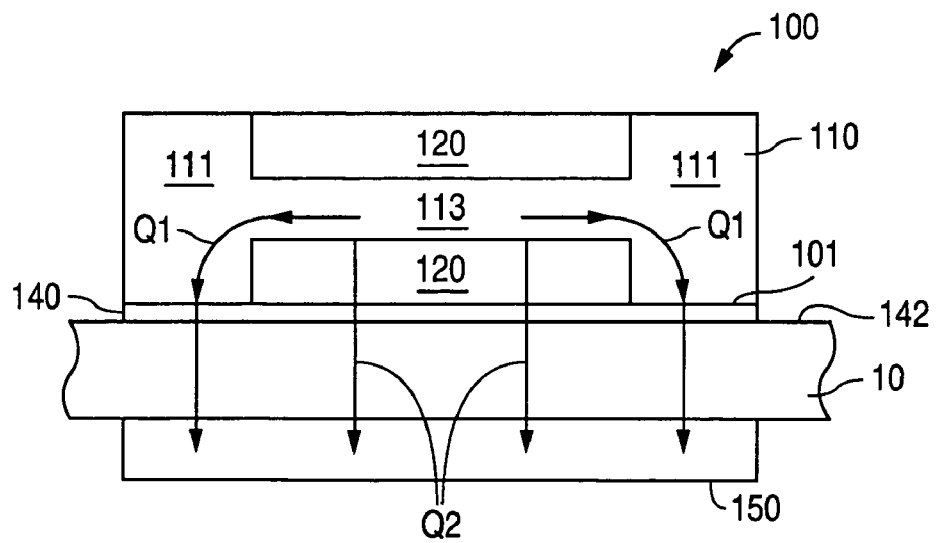
FIG. 6 is a schematic view of the present invention showing the flow of heat from the inventive inductive element to an adjacent structure.

FIG. 6 is a schematic view of the present invention showing the flow of heat from the inductive element 100. Heat core 110 is provided with two conductive paths to heat sink 150 according to the present invention as follows. The novel path, indicated by the arrows labeled Q1 does not pass through winding 120. Core 110, as well as core 400, 500, has ends 111 that protrude from elongated portion 113, which is the central portion of winding 120. The flow of heat as indicated by arrows Q1 is thus from elongated portion 113, through ends 111, and across to the surface 142 of PCB 10 (and optionally on to a heat sink 150), where it can be transferred away from inductive element 100. The second path is the conventional path, indicated by the arrows labeled Q2, that passes through winding 120. Heat generated in elongated portion 113 is conducted through winding 120, to PCB 10 (and again optionally to a heat sink 150). The added paths for heat transfer, and in particular path Q1 that bypasses the winding, greatly increase the amount of heat that can be removed from inductive element 100, thereby enabling the ability to better control the temperature of the inductive element.

In addition to the alternative windings discussed herein, it would be apparent to one skilled in the art that other core configurations, within the scope of the present invention, can be provided to allow the conduction of heat from the core. The inventive inductive element greatly increases the heat flow by providing a significantly enhanced lower thermal resistance pathway from the core to the heat sink, as opposed to prior art inductive elements where the flow of heat is only across the wires of the winding to the heat sink. The improved heat transfer characteristics of the inventive inductive element also allows for a smaller PCB footprint that prior art inductive elements.

The invention has now been explained with regard to specific embodiments. Variations on these embodiments and other embodiments may be apparent to those of skill in the art. It is therefore intended that the invention not be limited by the discussion of specific embodiments. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An inductive element comprising:
    a first magnetic core having a central elongated portion and two end portions, each said end portion defining an end portion planar surface, said central elongated portion having an approximately rectangular cross-sectional shape;
    a first winding wound about said elongated portion so as to create a substantially rectangular cross-sectional shape such that the outer surface of said winding defines a substantially rectangular planar surface, such that said substantially rectangular planar surface is coplanar with each said end portion planar surface; and
    a mounting frame to secure the wire ends of said first winding and to enable said first core and first winding to be surface mounted on an adjacent structure such that a portion of the planar surface of said adjacent structure is in contact with said end portion planar surfaces and said first winding planar surface to enhance heat transfer to said adjacent structure from said inductive element.

2. The inductive element of claim 1, wherein said adjacent structure is a printed circuit board and wherein said mounting frame further comprises posts for terminating the ends of said first winding adjacent to said printed circuit board.

3. The inductive element of claim 1, wherein said first winding is wound along approximately the entire length of said elongated portion of said core.

4. The inductive element of claim 1, further comprising:
a second magnetic core having an elongated portion and two end portions, each said end portion of said second core defining an end portion planar surface;
a second winding wound about said elongated portion of said second core, where the outer surface of said second winding defines a planar surface that is coplanar with each said second core end portion planar surface, and wherein said mounting frame further secures the wire ends of said second winding and is shaped to affix said first core end portions against corresponding second core end portions and such that the coplanar surfaces of said first core end portions and said first winding are coplanar with the coplanar surfaces of said second core end portions and said second winding.

5. A transformer comprising:
first and second magnetic cores each having a central elongated portion and two end portions, each said end portion defining an end portion planar surface so as to facilitate surface mounting of each said end portion on an adjacent structure, said elongated portion having an approximately rectangular cross-sectional shape area;
a winding wound about each said elongated portion of said two magnetic cores so as to create two substantially rectangular cross-sectional shapes such that the outer surface of each said winding defines a substantially rectangular planar surface so as to facilitate surface mounting of said winding on said adjacent structure, such that said substantially rectangular planar surface is coplanar with each said end portion planar surface of its respective core;
a material for affixing the end portions of said first and second magnetic cores together such that the end portion planar surface of each end portion of said first core is coplanar with the end portion planar surface of each end portion of said second core; and
a mounting frame surrounding said first and second magnetic cores, wherein said mounting frame secures the wire ends of each said winding and enables said first and second magnetic cores to be surface mounted on an adjacent structure such that a portion of the planar surface of said adjacent structure is in contact with said end portion planar surfaces and the planar surfaces of each said winding to enhance heat transfer to said adjacent structure from said transformer.

6. The transformer of claim 5, wherein said adjacent structure is a printed circuit board and wherein said mounting frame further comprises posts for terminating the ends of each said winding adjacent to said printed circuit board.

7. A method of forming an inductive element from a core having a central elongated portion having an approximately rectangular cross-sectional shape and two end portions, each said end portion defining an end portion planar surface, for mounting to an adjacent structure, comprising:
forming a winding of wire about said central elongated portion of said core so as to create a substantially rectangular cross-sectional shape such that the outer surface of said winding defines a substantially rectangular planar surface, such that said substantially rectangular planar surface is coplanar with a surface on each said end portion of said core; and
mounting said core in a mounting frame including securing the wire ends of said winding to post on said mounting frame so as to enable said core and winding to be surface mounted on said adjacent structure such that a portion of the planar surface of said adjacent structure is in contact with said end portion planar surfaces and said winding planar surface to enhance heat transfer to said adjacent structure from said inductive element.

8. The method of claim 7, wherein said core comprises a first core and wherein said method further comprises the steps of:
forming a second winding of wire about a central elongated portion of a second core to create a surface on said second winding that is coplanar with a surface on each end of said second core; and
joining said first core to said second core such that the coplanar surfaces of said first core are coplanar with the coplanar surfaces of said second core.

* * * * *